(12) United States Patent
Singleton et al.

(10) Patent No.: US 9,076,492 B2
(45) Date of Patent: Jul. 7, 2015

(54) SYSTEMS AND METHODS FOR RAPID ERASURE RETRY DECODING

(75) Inventors: Jefferson Singleton, Westminster, CO (US); Shaohua Yang, Santa Clara, CA (US)

(73) Assignee: LSI Corporation, San Jose, CA (US)

( * ) Notice: Subject to any disclaimer, the term of this patent is extended or adjusted under 35 U.S.C. 154(b) by 414 days.

(21) Appl. No.: 13/547,516

(22) Filed: Jul. 12, 2012

(65) Prior Publication Data

US 2014/0019695 A1    Jan. 16, 2014

(51) Int. Cl.

| G06F 11/00 | (2006.01) |
|---|---|
| G11B 20/18 | (2006.01) |
| G06F 11/14 | (2006.01) |
| H03M 13/45 | (2006.01) |
| G11B 20/10 | (2006.01) |

(52) U.S. Cl.
CPC ............ G11B 20/1833 (2013.01); G06F 11/14 (2013.01); H03M 13/45 (2013.01); G11B 20/10268 (2013.01); G11B 20/10527 (2013.01)

(58) Field of Classification Search
CPC ..... G06F 11/14; H03M 13/45; G11B 20/1833
See application file for complete search history.

(56) References Cited

U.S. PATENT DOCUMENTS

| 5,802,069 | A |   | 9/1998  | Coulson |
| 6,065,149 | A |   | 5/2000  | Yamanaka |
| 6,119,261 | A | * | 9/2000  | Dang et al. ................ 714/769 |
| 6,301,679 | B1 |  | 10/2001 | Tan |
| 6,446,236 | B1 |  | 9/2002  | McEwen |
| 6,738,948 | B2 |  | 12/2002 | Dinc et al. |
| 6,691,263 | B2 |  | 2/2003  | Vasic et al. |
| 6,697,977 | B2 |  | 2/2003  | Ozaki |
| 6,557,113 | B1 |  | 4/2003  | Wallentine |
| 6,731,442 | B2 |  | 4/2003  | Jin et al. |
| 7,237,173 | B2 |  | 4/2003  | Morita et al. |
| 6,980,382 | B2 |  | 5/2003  | Hirano et al. |
| 7,154,936 | B2 |  | 6/2003  | Bjerke et al. |
| 7,359,313 | B2 |  | 12/2003 | Chan et al. |
| 7,254,192 | B2 |  | 4/2004  | Onggosanusi |
| 7,257,172 | B2 |  | 4/2004  | Okamoto et al. |
| 7,203,015 | B2 |  | 2/2005  | Sakai et al. |
| 7,168,030 | B2 |  | 4/2005  | Ariyoshi |

(Continued)

FOREIGN PATENT DOCUMENTS

| EP | 0549151 | 6/1993 |
| EP | 1096491 | 10/2005 |
| WO | WO 01/39188 | 5/2001 |

OTHER PUBLICATIONS

ECMA: Standardizing Information and Communication Systems: "Standard ECMA-272: 120 mm DVD Rewritable Disk (DVD-RAM)" Standard ECMA, No. 272, Feb. 1, 1998 pp. 43-51.

(Continued)

*Primary Examiner* — Michael Maskulinski
(74) *Attorney, Agent, or Firm* — Hamilton DeSanctis & Cha

(57) ABSTRACT

Data processing systems, circuits and methods are disclosed. As one example, a data processing system is disclosed that includes: a buffer circuit, a data processing circuit, and an erasure window set circuit. The buffer circuit is operable to store a data set as a buffered data set, and the data processing circuit is operable to repeatedly apply a data processing algorithm to the buffered data set. The erasure window set circuit is operable to define a location of the erasure window in relation to the buffered data set.

23 Claims, 5 Drawing Sheets

(56) References Cited

U.S. PATENT DOCUMENTS

| | | | |
|---|---|---|---|
| 7,688,915 B2 | 12/2005 | Tanrikulu et al. | |
| 7,457,212 B2 | 3/2006 | Oh | |
| 7,652,966 B2 | 4/2006 | Kadokawa | |
| 7,441,174 B2 | 3/2007 | Li et al. | |
| 7,322,003 B2 * | 1/2008 | Ishii | 714/769 |
| 7,702,973 B2 | 7/2008 | Mead | |
| 8,201,051 B2 | 10/2008 | Tan | |
| 8,095,855 B2 | 9/2009 | Tan | |
| 8,161,357 B2 | 9/2009 | Tan | |
| 7,849,385 B2 | 10/2009 | Tan | |
| 8,121,224 B2 | 10/2009 | Tan | |
| 8,149,527 B2 | 10/2009 | Tan | |
| 7,924,518 B2 | 3/2010 | Mathew | |
| 8,139,457 B2 | 3/2010 | Cao | |
| 8,190,831 B2 | 5/2010 | Lee et al. | |
| 7,952,824 B2 | 9/2010 | Dziak | |
| 8,219,892 B2 | 9/2010 | Tan | |
| 7,843,660 B1 * | 11/2010 | Yeo | 360/53 |
| 7,852,722 B2 | 12/2010 | Kikugawa et al. | |
| 8,176,400 B2 | 3/2011 | Tan | |
| 8,650,457 B1 * | 2/2014 | Yeo | 714/758 |
| 2002/0041459 A1 | 4/2002 | Singer | |
| 2003/0043487 A1 | 3/2003 | Morita et al. | |
| 2003/0147172 A1 | 8/2003 | Singer et al. | |
| 2007/0061687 A1 | 3/2007 | Hwang | |
| 2010/0042877 A1 | 2/2010 | Tan | |
| 2010/0229031 A1 | 9/2010 | Tan | |
| 2010/0268996 A1 | 10/2010 | Yang | |
| 2010/0269023 A1 | 10/2010 | Yang | |
| 2011/0205653 A1 | 8/2011 | Mathew | |
| 2011/0209026 A1 | 8/2011 | Xia | |
| 2012/0087033 A1 | 4/2012 | Yang | |
| 2012/0254679 A1 | 10/2012 | Tan | |
| 2012/0266055 A1 | 10/2012 | Zhang | |

OTHER PUBLICATIONS

Kavcic et al., "A Signal-Dependent Autoregressive Channel Model", IEEE Transactions on Magnetics, vol. 35, No. 5, Sep. 1999 pp. 2316-2318.

U.S. Appl. No. 13/525,194, Unpublished (filed Jun. 15, 2012) (Bruce Wilson).

U.S. Appl. No. 13/459,289, Unpublished (filed Apr. 30, 2012) (Fan Zhang).

U.S. Appl. No. 13/452,722, Unpublished (filed Apr. 20, 2012) (Shaohua Yang).

U.S. Appl. No. 13/213,789, Unpublished (filed Aug. 19, 2011) (Ming Jin).

U.S. Appl. No. 13/368,599, Unpublished (filed Feb. 8, 2012) (Yang Cao).

* cited by examiner

SYSTEMS AND METHODS FOR RAPID ERASURE RETRY DECODING

BACKGROUND OF THE INVENTION

The present invention is related to storage media. More particularly, the present invention is related to systems and methods for identifying accessing data from a storage medium.

A typical storage medium includes a number of storage locations where data may be stored. Data is written to the medium within areas designated for user data by positioning a read/write head assembly over the medium at a particular location, and subsequently passing a modulated electric current through the head assembly such that a corresponding magnetic flux pattern is induced in the storage medium. To retrieve the stored data, the head assembly is positioned over a track containing the desired information and advanced until it is over the desired data. In this position, the previously stored magnetic flux pattern operates to induce a current in the head assembly. This induced current may then be converted to represent the originally recorded data. In some cases, data may not be retrievable from the storage medium due to, for example, media defects on the storage medium. This may lead to the permanent loss of data. As data may not be backed up on other systems, this loss can be costly where the data was valuable.

Hence, for at least the aforementioned reasons, there exists a need in the art for advanced systems and methods for recovering data derived from a storage medium or a transmission medium.

BRIEF SUMMARY OF THE INVENTION

The present invention is related to processing data sets, and more specifically to recovering problematic portions of a data set.

Various embodiments of the present invention provide data processing systems that include a buffer circuit, a data processing circuit, and an erasure window set circuit. The buffer circuit operable to stored the data set as a buffered data set. The data processing circuit is operable to repeatedly apply a data processing algorithm to the buffered data set. Applying the data processing algorithm includes reducing a likelihood that a plurality of elements of the buffered data set within an erasure window were properly set during a preceding application of the data processing algorithm to yield a processed output. The erasure window set circuit is operable to define a location of the erasure window of a window size in relation to the buffered data set, wherein the erasure window set circuit is operable to: offset the erasure window from the beginning of the buffered data set by a first offset for a first pass through the buffered data set, offset the erasure window from the beginning of the buffered data set by a second offset for a second pass through the buffered data set, and offset the erasure window from the beginning of the buffered data set by a third offset for a third pass through the buffered data set. The third pass through the buffered data set occurs subsequent to the second pass through the buffered data set, and the third offset is less than the second offset.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
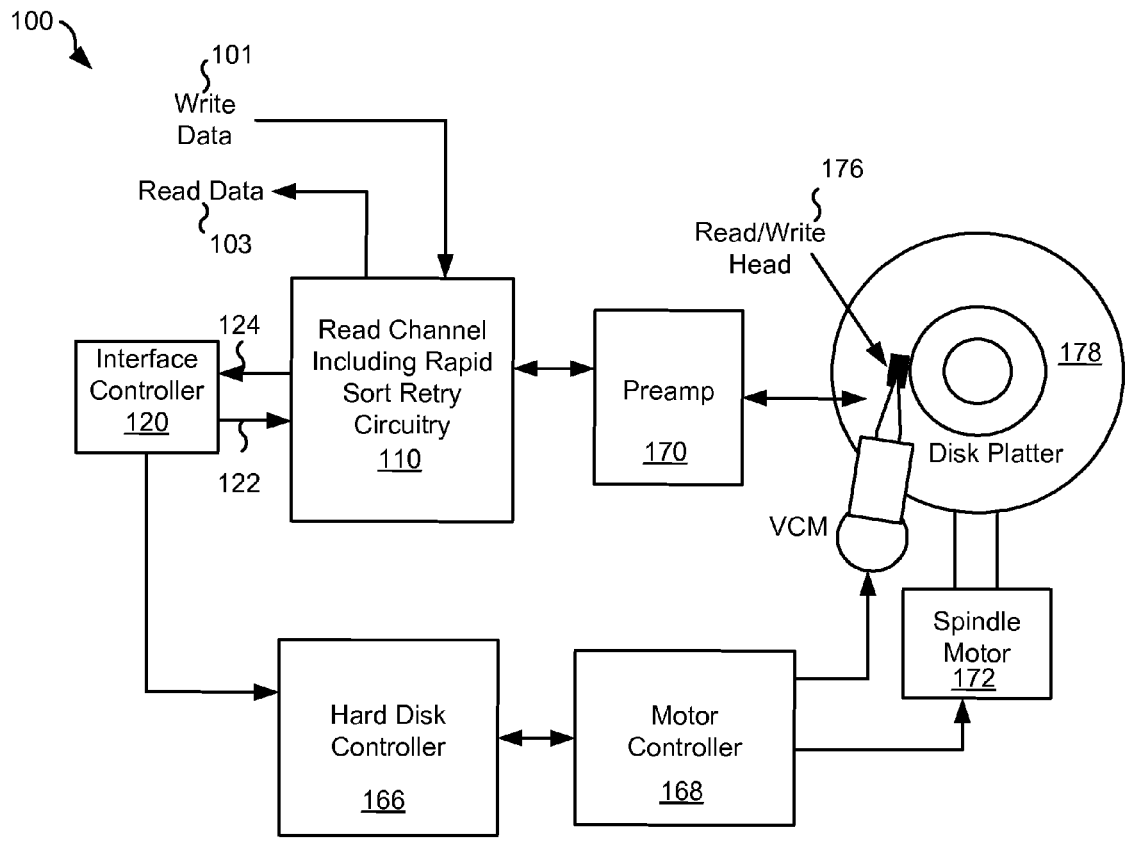
FIG. 1 shows a storage system including rapid sort retry circuitry in accordance with one or more embodiments of the present invention.

The present invention is related to processing data sets, and more specifically to recovering problematic portions of a data set.

Various embodiments of the present invention provide systems and methods for performing data processing retries by re-processing buffered data using modified parameters. In particular, some embodiments of the present invention modify or erase soft data over a defined window, and then reprocess the corresponding data set. The defined window is then moved over different regions of a data set in accordance with a rapid search algorithm and each time the defined window is moved the corresponding data set is reprocessed. This soft data modification followed by data reprocessing is repeated until all errors in the corresponding data set are corrected, or until a timeout condition is met. Using such an approach, soft data corresponding to regions where media defects occurred or where noise anomalies occurred can be set (e.g., erased) so that it does not affect data processing. This erasure enhances the possibility that a data processing circuit can correct errors corresponding to the defective region or noise anomalies. By using a rapid search algorithm the time required to substantially cover all potential portions of the data set corresponding to a media defect or a noise anomaly may be dramatically reduced.

Various embodiments of the present invention provide data processing systems that include a buffer circuit, a data processing circuit, and an erasure window set circuit. The buffer circuit operable to stored the data set as a buffered data set. The data processing circuit is operable to repeatedly apply a data processing algorithm to the buffered data set. Applying the data processing algorithm includes reducing a likelihood that a plurality of elements of the buffered data set within an erasure window were properly set during a preceding application of the data processing algorithm to yield a processed output. The erasure window set circuit is operable to define a location of the erasure window of a window size in relation to the buffered data set, wherein the erasure window set circuit is operable to: offset the erasure window from the beginning of the buffered data set by a first offset for a first pass through the buffered data set, offset the erasure window from the beginning of the buffered data set by a second offset for a second pass through the buffered data set, and offset the erasure window from the beginning of the buffered data set by a third offset for a third pass through the buffered data set. The third pass through the buffered data set occurs subsequent to the second pass through the buffered data set, and the third offset is less than the second offset.

In some instances of the aforementioned embodiments, the window size is programmable. In one or more instances of the aforementioned embodiments, the second offset and the third offset are each a function of the window size. In some cases, the second offset is one half the window size and the third offset is one quarter the window size. In some instances of the aforementioned embodiments, the second offset and the third offset are each a function of a defined offset size. In some cases, the defined offset size is programmable.

In various instances of the aforementioned embodiments, the erasure window set circuit is further operable to: indicate a first start location of the erasure window as the first offset, and calculate a second start location of the erasure window as the first offset plus a step size; indicate a third start location of the erasure window as the second offset, and calculate a fourth start location of the erasure window as the second offset plus the step size; and indicate a fifth start location of the erasure window as the third offset, and calculate a sixth start location of the erasure window as the third offset plus the step size. In some such instances, the step size is the window size.

In various instances of the aforementioned embodiments, the data processing system is implemented as part of an integrated circuit. in particular instances of the aforementioned embodiments, the data processing system is implemented as part of a storage device. In one or more instances of the aforementioned embodiments, the data processing circuit includes a data detector circuit operable to apply a data detection algorithm to the buffered data set to yield a detected output, and a data decoding circuit operable to apply a data decode algorithm to the detected output to yield the processed output. In some cases, the data processing algorithm includes the data detection algorithm and the data decode algorithm. In various cases, the data detector circuit is a maximum a posteriori data detector circuit, and the data decoding circuit is a low density parity check decoding circuit.

Other embodiments of the present invention provide methods for retry processing that include: buffering a series of data samples to yield a series of buffered data samples; determining a first offset of an erasure window from the beginning of the a series of buffered data samples; applying a data processing algorithm to the series of buffered data samples that includes reducing a likelihood that a plurality of elements of the series of buffered data samples within the erasure window having the first offset were properly set during a preceding application of the data processing algorithm to yield a first processed output; determining a second offset of the erasure window from the beginning of the a series of buffered data samples; re-applying the data processing algorithm to the series of buffered data samples that includes reducing a likelihood that a plurality of elements of the series of buffered data samples within the erasure window having the second offset were properly set during a preceding application of the data processing algorithm to yield a second processed output; determining a third offset of the erasure window from the beginning of the a series of buffered data samples; and re-applying the data processing algorithm to the series of buffered data samples that includes reducing a likelihood that a plurality of elements of the series of buffered data samples within the erasure window having the third offset were properly set during a preceding application of the data processing algorithm to yield a second processed output. The third offset is less than the second offset.

Figure 3B:
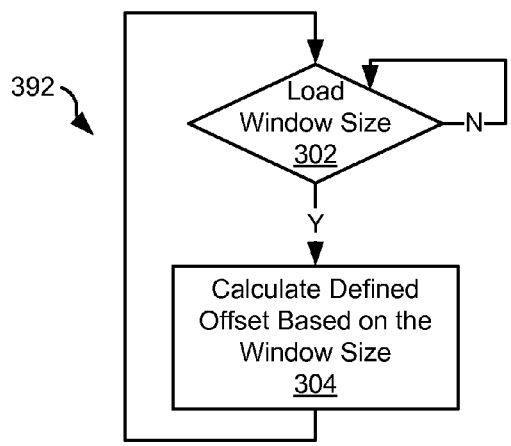
FIGS. 3a-3b show a method in accordance with some embodiments of the present invention for rapid retry processing.

Turning to FIG. 1, a storage system 100 including a read channel circuit 110 with rapid sort retry circuitry is shown in accordance with various embodiments of the present invention. Storage system 100 may be, for example, a hard disk drive. The incorporated rapid sort retry circuitry may be any circuitry capable of performing a number of data processing retries on a given data set each time erasing soft data associated with the data set over a defined window. Where the given data retry processing does not converge (i.e., correct all remaining errors in the data set), the defined window is moved to another location and the data retry processing on the data set is done again. The location of the defined window on each data processing retry is determined based upon a rapid search algorithm in accordance with the present inventions. Some examples of such rapid sort retry circuitry are discussed below in relation to FIG. 2 and FIG. 5, and a method for applying the rapid sort retry may be done in accordance with that discussed below in relation to FIGS. 3a-3b and 4.

In addition to read channel circuit 110, storage system 100 includes an interface controller 120, a preamplifier circuit 170, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly 176 to the proper data track on disk platter 178 under the direction of hard disk controller 166. Spindle motor 172 spins disk platter 178 at a determined spin rate (RPMs).

Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier circuit 170. Preamplifier circuit 170 is operable to amplify the minute analog signals accessed from disk platter 178. In addition, preamplifier circuit 170 is operable to amplify data from read channel circuit 110 that is destined to be written to disk platter 178. In turn, read channel module 110 decodes (including media defect detection) and digitizes the received analog signal to recreate the information originally written to disk platter 178. This data is provided as read data 103 to a receiving circuit. Where read channel circuit 110 is unable to obtain the originally written data during normal processing, data retry processing may be applied. Such data retry processing operates as described above with an erasure window being moved in accordance with a rapid sort algorithm in relation to the data set being processed. A write operation is substantially the opposite of the preceding read operation with write data 101 being provided to read channel circuit 110. This data is then encoded and written to disk platter 178.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
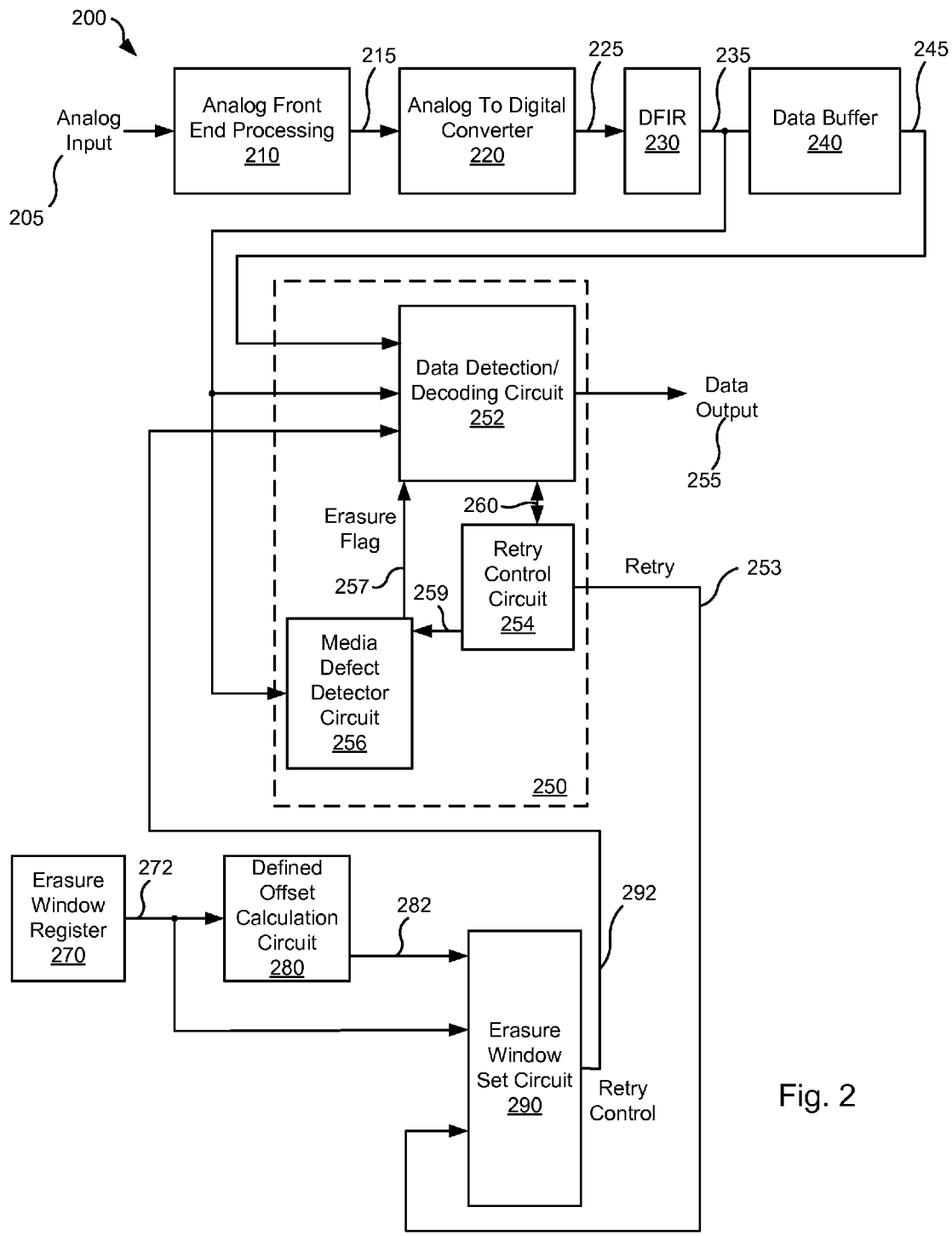
FIG. 2 shows a data processing system including rapid retry sort circuitry in accordance with some embodiments of the present invention.

Turning to FIG. 2, a data processing system 200 including rapid retry sort circuitry is shown in accordance with some embodiments of the present invention. Data processing system 200 includes an analog front end processing circuit 210 that receives an analog input 205. Analog front end processing circuit 210 may include a variety of analog processing circuitry capable of massaging analog input 205 into a useful signal that is provided as an analog processed input 215. In particular, analog front end processing circuit 210 may include, but is not limited to, an equalizer circuit, an amplifier circuit, and/or an analog filter circuit. Based upon the disclosure provided herein, one of ordinary skill in the art will recognize a variety of circuits that may be used in relation to different embodiments of the present invention.

Analog processed input 215 is provided to an analog to digital converter circuit 220 that samples the input at a sampling rate and provides a series of digital samples 225 to a digital finite impulse response filter 230. Analog to digital converter circuit 220 may be any circuit known in the art that is capable of converting an analog input signal into a corresponding series of digital samples. Digital finite impulse response filter 230 may be any digital finite impulse response filter known in the art. Digital finite impulse response filter 230 provides a filtered output 235 to both a data buffer 240 and to a data processing circuit 250. In some embodiments of the present invention, digital finite impulse response filter 230 operates to equalized the received input. In such cases, the filtered output 240 is an equalized output.

Data buffer 240 may be any storage device capable of buffering one or more sets of data. In some embodiments, a set of data is a full sector of data derived from a magnetic storage medium, and data buffer 240 is a non-volatile random access memory. In other cases, data buffer 240 is a dynamic random access memory. Based upon the disclosure provided herein, one of ordinary skill in the art will recognize a variety of storage devices that may be used in relation to different embodiments of the present invention. As more fully described below, the information stored in data buffer 240 may be used for one or more data retry processes attempting to correct errors in digital samples 235 that were not correctable during initial data processing attempts. For the purposes of this document, the phrase "data retry" refers to a data processing using buffered data.

Data processing circuit 250 includes a media defect detector circuit 256 as is known in the art. Media defect detector circuit 256 may be any circuit known in the art that is capable of performing a media defect detection on a data input. U.S. patent application Ser. No. 12/114,462 entitled "Systems and Methods for Media Defect Detection", and filed Apr. 29, 2008 by Tan et al.; and U.S. patent application Ser. No. 12/425,626 entitled "Systems and Methods for Multilevel Media Defect Detection", and filed Apr. 17, 2009 by Yang et al. each disclose some examples of data detection/decoding circuits that may be used in relation to different embodiments of the present invention. The entirety of the aforementioned patent applications is incorporated herein by reference for all purposes. Based upon the disclosure provided herein, one of ordinary skill in the art will recognize a variety of media defect detection circuits that may be used in relation to different embodiments of the present invention. Media defect detector circuit 256 receives filtered output 235 and performs a media defect detection on filtered output 235. The media defect detection process generates an erasure flag 257 that corresponds to the region of the detected media defect. Erasure flag 257 is also provided to a data detection/decoding circuit 252. In addition, media defect detector circuit 256 receives a parameter input 259 from a retry control circuit 254 that allows for changing the operational parameters (e.g., the media defect threshold and/or defect window) of media defect detector circuit 256.

Data processing circuit 250 further includes a data detection/decoding circuit 252 as is known in the art. Data detection/decoding circuit 252 includes one or more data detection circuits that apply a data detection algorithm to the received data, and one or more decoding circuits that apply a data decoding algorithm to the received data. U.S. patent application Ser. No. 12/114,462 entitled "Systems and Methods for Queue Based Data Detection and Decoding", and filed May 2, 2008 by Yang et al. discloses some examples of data detection/decoding circuits that may be used in relation to different embodiments of the present invention. The entirety of the aforementioned patent application is incorporated herein by reference for all purposes. Based upon the disclosure provided herein, one of ordinary skill in the art will recognize a variety of data detection and/or data decoding circuits that may be used in relation to different embodiments of the present invention. Data detection/decoding circuit 252 provides a data output 255.

Convergence or non-convergence of data output 255 is reported as a control signal 260 to retry control circuit 254. Where data output 255 converges (i.e., data errors are corrected), it is provided as an output and retry control circuit 254 de-asserts a retry output signal 253 indicating that no retry is desired. In addition, retry control circuit 254 resets the value of parameter input 259 that is provided to media defect detector circuit 256.

Otherwise, where data output 255 fails to converge (i.e., fails to correct all errors), one or more different retry processes may be triggered. For example, in one embodiment of the present invention, another normal data processing attempt is made using different media defect parameters. In such a case, updated parameters are provided to media defect detector circuit 256 via parameter input 259. The updated parameters may be selected to detect additional media defects that were not previously detected. As an example, the threshold for identifying a media defect may be lowered. This provides a greater opportunity to detect a media defect, but at the cost of an increased potential of misidentifying media defects. Using the new media defect parameters, a second data processing is started where data is re-introduced via analog input 205 and re-processed. Where the second re-processing fails to converge, a data retry is triggered by asserting retry output signal 253. Alternatively, in another embodiment of the present invention, a data retry is triggered whenever data output 255 fails to converge. In such a case, retry control circuit 254 asserts retry output signal 253 and resets the value of parameter input 259 that is provided to media defect detector circuit 256 whenever a failure to converge is indicated by data detection/decoding circuit 252.

When retry processing is selected as indicated by assertion of retry output signal 253 by retry control circuit 254, an erasure window set circuit 290 provides an erasure control signal 292 indicating a window size and window location over which erasure should be applied by data detection/decoding circuit 252. The window size is programmable via an erasure window register 270 that provides a window size 272 that may be programmed with a number of bit positions over which an erasure is to be applied. Window size 272 is provided to erasure window set circuit 290. In some embodiments of the present invention, erasure control signal 292 defines a window of window size 272 that starts at an offset of zero relative to buffered data 245. Soft data corresponding to the defined window of buffered data 245 is modified. In some cases, the modification includes erasing the soft data so that the reliability of buffered data 245 corresponding to the defined window is indicated as low. In other cases, the soft data is not erased, but rather just reduced. Either way, modifying the soft data in this way allows the data detection algorithm and data decode algorithm applied by data detection/decoding circuit 252 to more readily modify the corresponding elements of buffered data 245.

Where the data processing applied by data detection/decoding circuit 252 converges, data output 255 is provided and the retry processing completes. Otherwise, where the data processing applied by data detection/decoding circuit 252 fails to converge, erasure window set circuit 290 provides an updated erasure control signal 292 and the processing of data detection/decoding circuit 252 is done again. In some embodiments of the present invention, the erasure control signal 292 defines a window of window size 272 that starts at the end point of the previous window and extends over the window size 272 relative to buffered data 245. Thus, for the second retry data processing period, the defined window starts at a location offset from zero by window size 272 and extending over window size 272. This process of data retry continues until either the data processing applied by data detection/decoding circuit 252 converges or until the end of buffered data 245 is reached. The start location of the defined window for each application of the data processing by data detection/decoding circuit 252 may be calculated in accordance with the following equation:

$$\text{Start } Location_i = i^*(\text{Window Size 272}),$$

$$\text{for } i = 0, 1, 2 \ldots \frac{\text{Size(Buffered Data 245)}}{\text{Window Size 272}}.$$

Figure 4A:
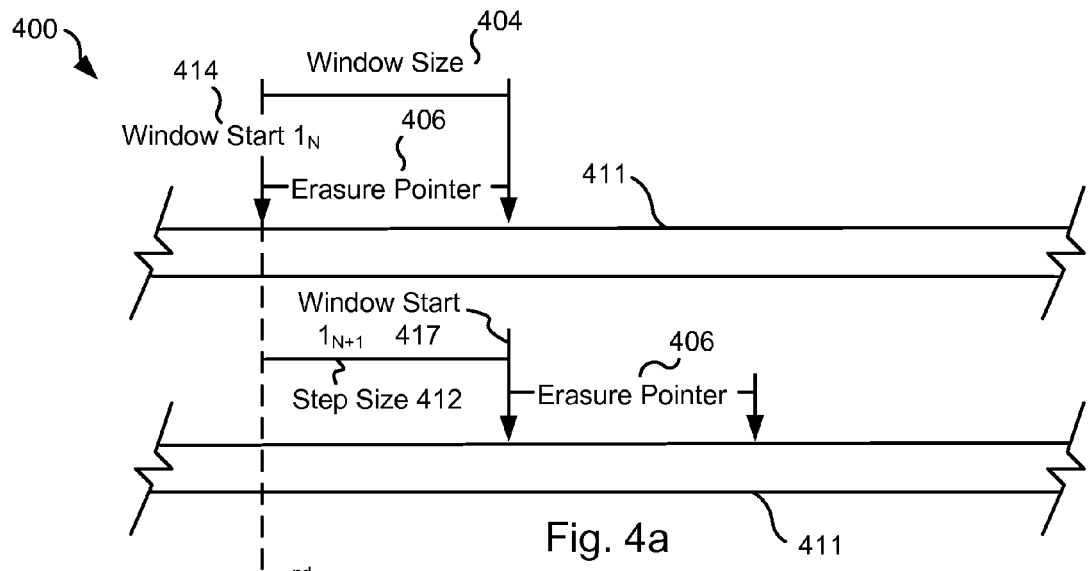
FIG. 4a graphically depicts a rapid retry during an initial pass after data processing failure in accordance with various embodiments of the present invention.

Turning to FIG. 4a, a timing diagram 400 graphically depicts a rapid retry during an initial pass (e.g., n=0) after data processing failure in accordance with various embodiments of the present invention. Following timing diagram 400, a series of digital samples 411 have an erasure pointer 406 generated by erasure flag circuit 290. Erasure pointer 406 begins at a start location (i.e., Window Start $1_N$ 414) that corresponds to a point within digital samples 411 (i.e., at the start of buffered data 245) and extends a window size 404 from the start location. Window size 404 is the same as window size 272. Where the data processing through data detection/decoding circuit 252 fails to converge using the aforementioned location of erasure pointer 406, the location of erasure pointer 406 is updated by applying a step size 412 equal to window size 404 to yield a new start location (i.e., Window Start $1_{N+1}$ 417) and the data processing is retried using erasure corresponding to the new window location. This process continues by stepping the erasure window along digital samples 411 until either the data processing converges or until the end of digital samples is reached.

Referring again to FIG. 2, where application of the data processing by data detection/decoding circuit 252 fails to converge over the length of buffered data 245, an offset 282 is calculated by a defined offset calculation circuit 280 and provided to erasure window set circuit 290. Offset 282 is a function of window size 272. In one particular embodiment of the present invention, the offset for the second pass through buffered data 245 is window size divided by two. For the initial processing of the second pass through buffered data 245, erasure window set circuit 290 provides an updated erasure control signal 292 and the processing of data detection/decoding circuit 252 is done again. The updated erasure control signal 292 defines a window of window size 272 that starts at offset 282 and extends over the window size relative to buffered data 245. Where the data processing applied by data detection/decoding circuit 252 converges, data output 255 is provided and the retry processing completes. Otherwise, where the data processing applied by data detection/decoding circuit 252 fails to converge, erasure window set circuit 290 provides an updated erasure control signal 292 and the processing of data detection/decoding circuit 252 is done again. In some embodiments of the present invention, the erasure control signal 292 defines a window of window size 272 that starts at the end point of the previous window and extends over the window size 272 relative to buffered data 245. Thus, for the second retry data processing period, the defined window starts at a location offset from zero by window size 272 and extending over window size 272. This process of data retry continues until either the data processing applied by data detection/decoding circuit 252 converges or until the end of buffered data 245 is reached. The start location of the defined window for each application of the data processing by data detection/decoding circuit 252 may be calculated in accordance with the following equation:

$$\text{Start Location}_i = \text{Offset } 282 + i^*(\text{Window Size } 272),$$
$$\text{for } i = 0, 1, 2 \ldots \frac{\text{Size(Buffered Data 245)}}{\text{Window Size 272}}.$$

A value of zero for i indicates the initial application of the data processing by data detection/decoding circuit 252, and larger values of i indicate subsequent application of the data processing.

Figure 4B:
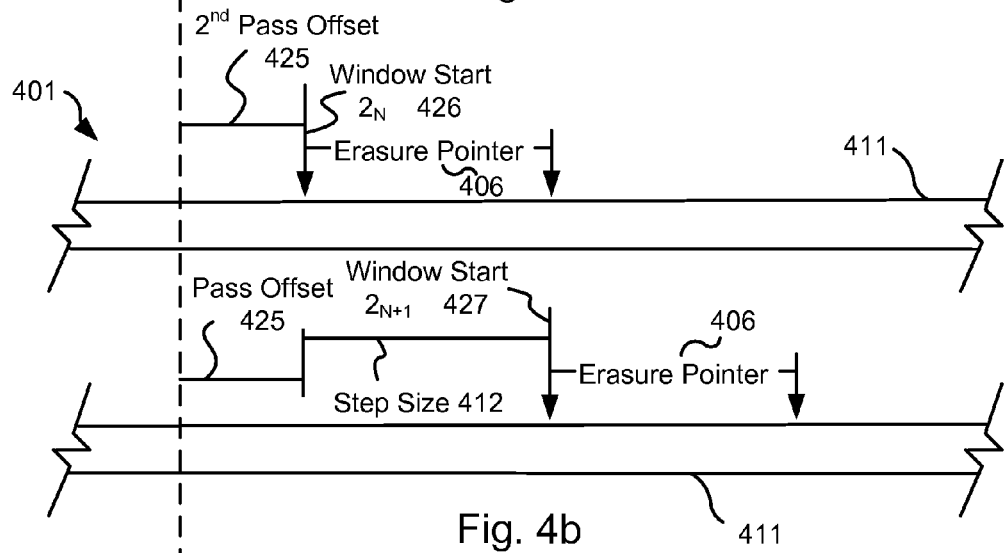
FIG. 4b graphically depicts the rapid retry during a first subsequent pass after the initial pass of FIG. 4a in accordance with various embodiments of the present invention.

Turning to FIG. 4b, a timing diagram 401 graphically depicts a rapid retry during second pass (e.g., n=1) after data processing failure in accordance with various embodiments of the present invention. Following timing diagram 401, digital samples 411 have erasure pointer 406 generated by erasure flag circuit 290. Erasure pointer 406 begins at a start location (i.e., Window Start $2_N$ 426) that corresponds to a point within digital samples 411 (i.e., at the start of buffered data 245 plus offset 282 and referred to as a second pass offset 425) and extends a window size 404 from the start location. Second pass offset 425 is one half of window size 272 for the second pass. Where the data processing through data detection/decoding circuit 252 fails to converge using the aforementioned location of erasure pointer 406, the location of erasure pointer 406 is updated by applying a step size 412 equal to window size 404 plus pass offset 425 to yield a new start location (i.e., Window Start $2_{N+1}$ 427) and the data processing is retried using erasure corresponding to the new window location. This process continues by stepping the erasure window by window size 272 along digital samples 411 until either the data processing converges or until the end of digital samples is reached.

Referring again to FIG. 2, for the third and later passes, the offset calculation by defined offset calculation circuit 280 is applied to yield an updated offset 282. The updated offset may be calculated in accordance with the following equation:

$$\text{Offset } 282_n = \frac{\text{Window Size 272}}{2^{n-1}},$$
$$\text{for } n = 1, 2, 3 \ldots \text{maximum passes}.$$

A value of one for n indicates the first pass through buffered data 245, and larger values of n indicate subsequent passes through buffered data 245. With the updated offset 282, the same process described above in relation to the second pass is done for the third and later passes. Maximum passes corresponds to a maximum number of passes through buffered data 245 without convergence that are allowed before retry processing is considered a failure.

Figure 4C:
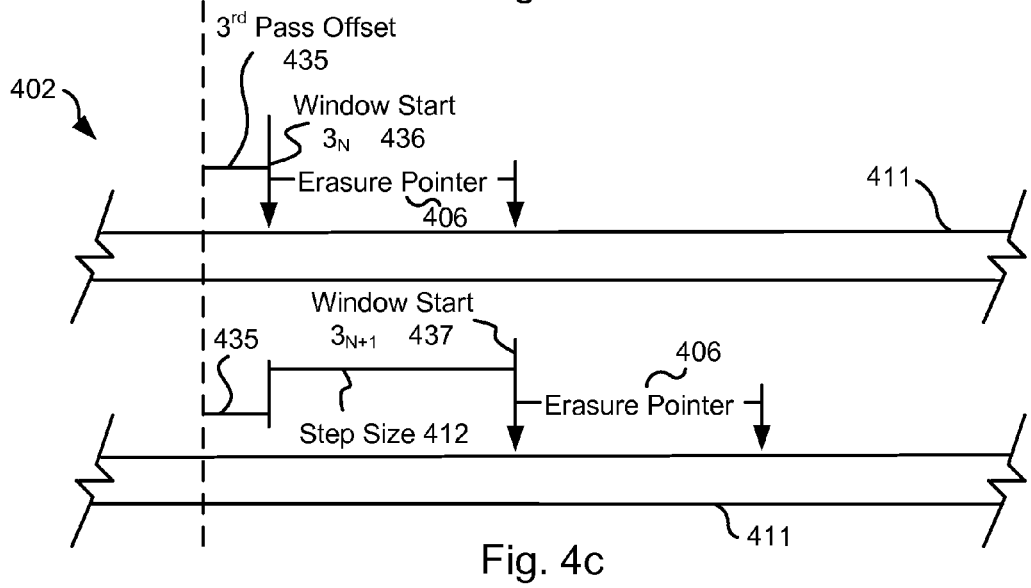
FIG. 4c graphically depicts the rapid retry during a second subsequent pass after the initial pass of FIG. 4a in accordance with various embodiments of the present invention.

Turning to FIG. 4c, a timing diagram 402 graphically depicts a rapid retry during second pass (e.g., n=1) after data processing failure in accordance with various embodiments of the present invention. Following timing diagram 402, digital samples 411 have erasure pointer 406 generated by erasure flag circuit 290. Erasure pointer 406 begins at a start location (i.e., Window Start $3_N$ 436) that corresponds to a point within digital samples 411 (i.e., at the start of buffered data 245 plus offset 282 and referred to as a third pass offset 435) and extends a window size 404 from the start location. Third pass offset 435 is one quarter of window size 272 for the third pass. Where the data processing through data detection/decoding circuit 252 fails to converge using the aforementioned location of erasure pointer 406, the location of erasure pointer 406 is updated by applying a step size 412 equal to window size 404 plus pass offset 435 to yield a new start location (i.e., Window Start $3_{N+1}$ 437) and the data processing is retried using erasure corresponding to the new window location. This process continues by stepping the erasure window along digital samples 411 by window size 272 until either the data processing converges or until the end of digital samples is reached. This process may be repeated for fourth and later passes with the pass offset being divided by two for each successive pass.

Referring again to FIG. 2, the following pseudocode describes the operation of data processing system 200 in accordance with some embodiments of the present invention.

```
If (Retry Output Signal 253 is De-Asserted) {
    Apply Standard Processing by Data Processing Circuit 250;
    If (Data Output 255 Converged){
        Provide Data Output 255
    }
    Else If (Data Output 255 Failed to Converge){
        Assert Retry Output Signal 253;
    }
}
Else If (Retry Output Signal 253 is Asserted){
    Set Process Counter i = 0;
    Set Pass Counter n = 0;
    Set Offset 282 = 0;
    If (n<Maximum Passes){
        Set the Start of the Modification Window = Offset 282 +
          (Window Size 272) *i;
        Apply Standard Processing by Data Processing Circuit 250;
        If (Data Output 255 Converged){
            Provide Data Output 255;
            Set n =Maximum Passes;
            Set i = Size(Buffer Data 245) / Window Size 272;
        }
        Else If (Data Output 255 Failed to Converge){
            Set i = i +1;
            If (i > Size(Buffer Data 245) divided by Window Size 272){
                Set n = n +1;
                Set Offset 282 = Window Size 272 / 2^n
            }
        }
    }
    Else If (n = Maximum Passes){
        De-assert Retry Output Signal 253;
    }
}
```

Of note, the aforementioned approach searches only 0, (Window Size 272)/2, (Window Size 272)/4, (Window Size 272)/8, and on. Other embodiments of the present invention are modified to make a more extensive search to include additional possibilities including: 0, (Window Size 272)/2, (Window Size 272)/4, 3*(Window Size 272)/4, (Window Size 272)/8, 3*(Window Size 272)/8, 5*(Window Size 272)/8, 7*(Window Size 272)/8, and on. Additionally, data processing system 200 may have enough bandwidth to operate on more than one sector at a time. In such a case, this bandwidth capability may be applied to processing two or more different scenarios at the same time, that is, have the detector/decoder working on multiple instances of the same data with the erasure window at a different position each time. Such an approach could be used reduce the overall recovery time by a factor of however many simultaneous scenarios can be simultaneously run.

Figure 3A:
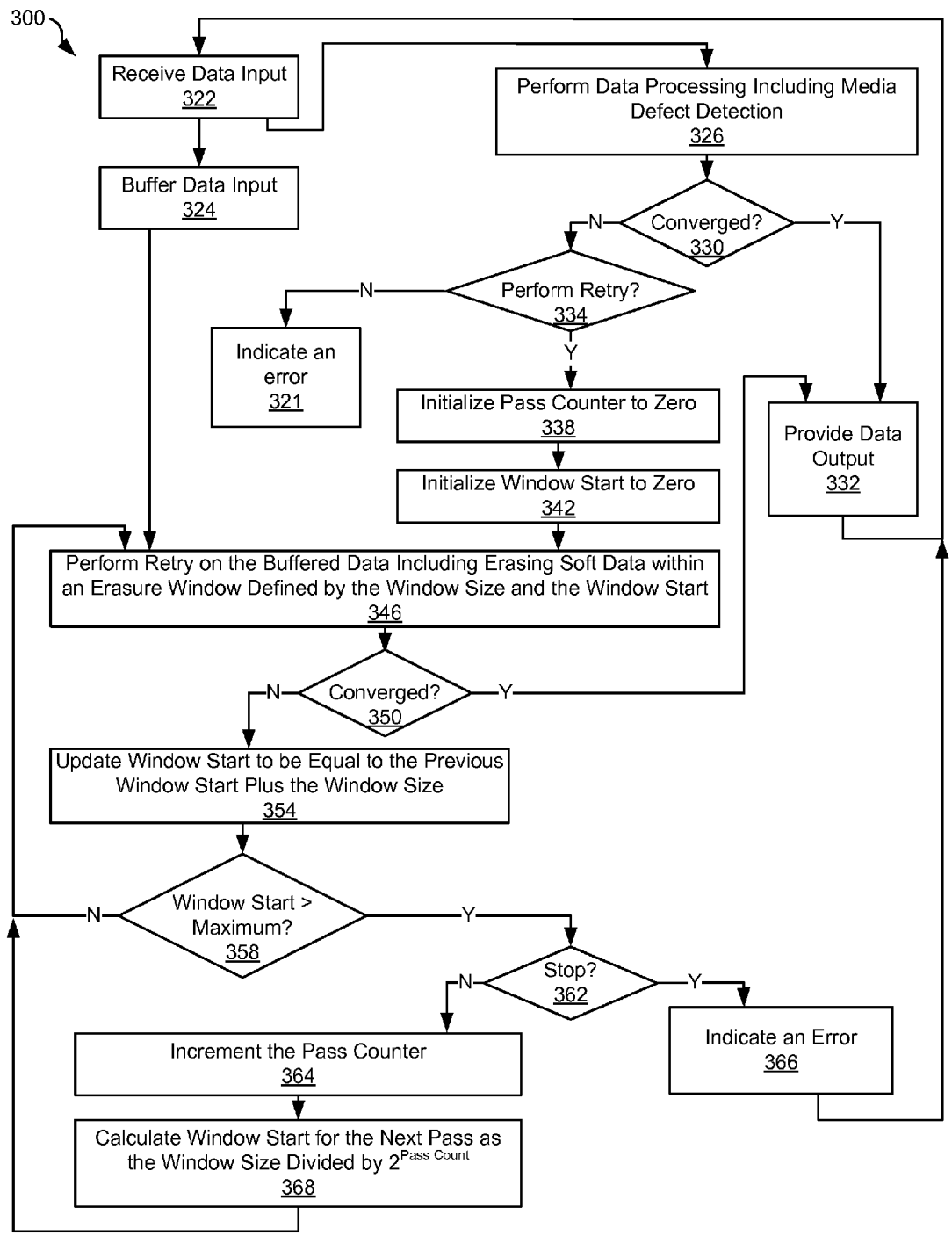

Turning to FIG. 3a, a flow diagram 300 shows a method in accordance with some embodiments of the present invention for rapid retry processing. Following flow diagram 300, data is received from a data source (block 322). The data source may be, for example, a magnetic storage medium and any intervening processing circuitry. Based upon the disclosure provided herein, one of ordinary skill in the art will recognize other source for the data input. The data input is stored to a data buffer (block 324). The data buffer may be any circuit capable of storing information such as a non-volatile random access memory or a dynamic random access memory.

The receive data is then processed including media defect detection (block 326). This data processing may include, but is not limited to, applying a data detection algorithm to the data set to yield a detected output, and subsequently applying a data decode algorithm to the decoded output to yield a decoded output. In some cases, more than one pass applying the data detection algorithm and data decode algorithm are performed each time using the results of the previous pass to guide subsequent passes. Such passes may be generically referred to as global iterations. Further, in various cases, more than one pass applying the data decode algorithm are performed during each global iteration. Such passes are referred to generically as local iterations.

In addition, a media defect detection process is performed to determine whether the region from which the received data was derived is defective. Where a defect is detected, an erasure pointer is asserted causing the data processing to process the data from the defective region differently. The combination of data processing and media defect detection may be done using any approaches known in the art. When the data processing completes, it is determined whether the data processing converged (block 330). Where the data processing converged (block 330), the resulting data output is provided (block 332).

Alternatively, where the data processing failed to converge (block 330), it is determined whether a data retry is desired (block 334). Where are retry is not desired (block 334), an error is indicated (block 321). Otherwise, where a retry is desired (block 334), a pass counter (n) is initialized to zero (block 338), and a window start location is initialized to zero (block 342). Retry processing is then applied to the originally received data set accessed from the data buffer (block 346). During the retry processing an erasure window is applied. Applying the erasure window includes modifying soft data of the data from the data buffer that corresponds to an erasure window location to increase the likelihood that that data is modified on subsequent passes through data detection and decoding processes. The erasure window is defined by a window size and a window start location. For the first pass through the buffered data and the first application of the data processing during the first pass, the window start is the beginning of the buffered data (i.e., an offset of zero) and the window size is received from a user via a window size register.

It is determined whether the data processing resulted in a converged codeword (block 350). Where the processing resulted in a converged codeword (block 350), the converged codeword is provided as a data output (block 332). Otherwise, where the processing did not result in a converged codeword (block 350), the window start location is updated to be equal to the prior window start location plus the window size (block 354). It is then determined whether the updated window start location is greater than a maximum (i.e., extends beyond the end of the buffered data) (block 358). Where it is not greater than a maximum (block 358), the processes of blocks 346-358 are repeated for the updated window start location.

Turning to FIG. 4a, timing diagram 400 graphically depicts a rapid retry during an initial pass (e.g., Initial Pass Counter=0) after data processing failure in accordance with various embodiments of the present invention. Following timing diagram 400, digital samples 411 have an erasure pointer 406 that begins at a start location (i.e., Window Start $1_N$ 414) that corresponds to a point within digital samples 411 (i.e., zero) and extends a window size 404 from the start location. Where the data processing (block 346) fails to converge using the aforementioned location of erasure pointer 406, the location of erasure pointer 406 is updated by applying step size 412 equal to window size 404 to yield a new start location (i.e., Window Start $1_{N+1}$ 417) (block 354) and the data processing is retried using erasure corresponding to the new window location. This process continues by stepping the erasure window along digital samples 411 until either the data processing converges or until the end of digital samples is reached (block 358).

Returning to FIG. 3, where the window start location is not greater than a maximum (block 358), it is determined whether additional retry processing is desired (block 362). Retry processing may be programmed to continue until either the data processing converges or a defined number of passes (n) through the buffered data are completed. In one particular embodiment of the present invention, retry processing continues for up to four passes through the buffered data using different offsets on each pass. Based upon the disclosure provided herein, one of ordinary skill in the art will recognize a variety of conditions or numbers of passes that may be used to indicate that processing has completed. Where additional retry processing is not allowed (block 362), an error is indicated (block 366).

Alternatively, where additional retry processing is allowed (block 362), the pass counter is incremented indicating the beginning of a subsequent pass (block 364). In addition, a window start for the first instance of data processing of the next pass is calculated (block 368) in accordance with the following equations:

$$\text{Initial Window } Start_n = \frac{\text{Window Size}}{2^n},$$

for $n = 1, 2, 3 \ldots$ maximum passes.

A value of one for n indicates the first pass through the buffered data, and larger values of n indicate subsequent passes through the buffered data. Using this newly calculated window start value (block 368), the processes of blocks 346-368 are repeated for the next pass through the buffered data. FIG. 4b and FIG. 4c graphically depict the movement of the erasure window in relation to the buffered data set for an example second and third passes through the buffered data.

Figure 5:
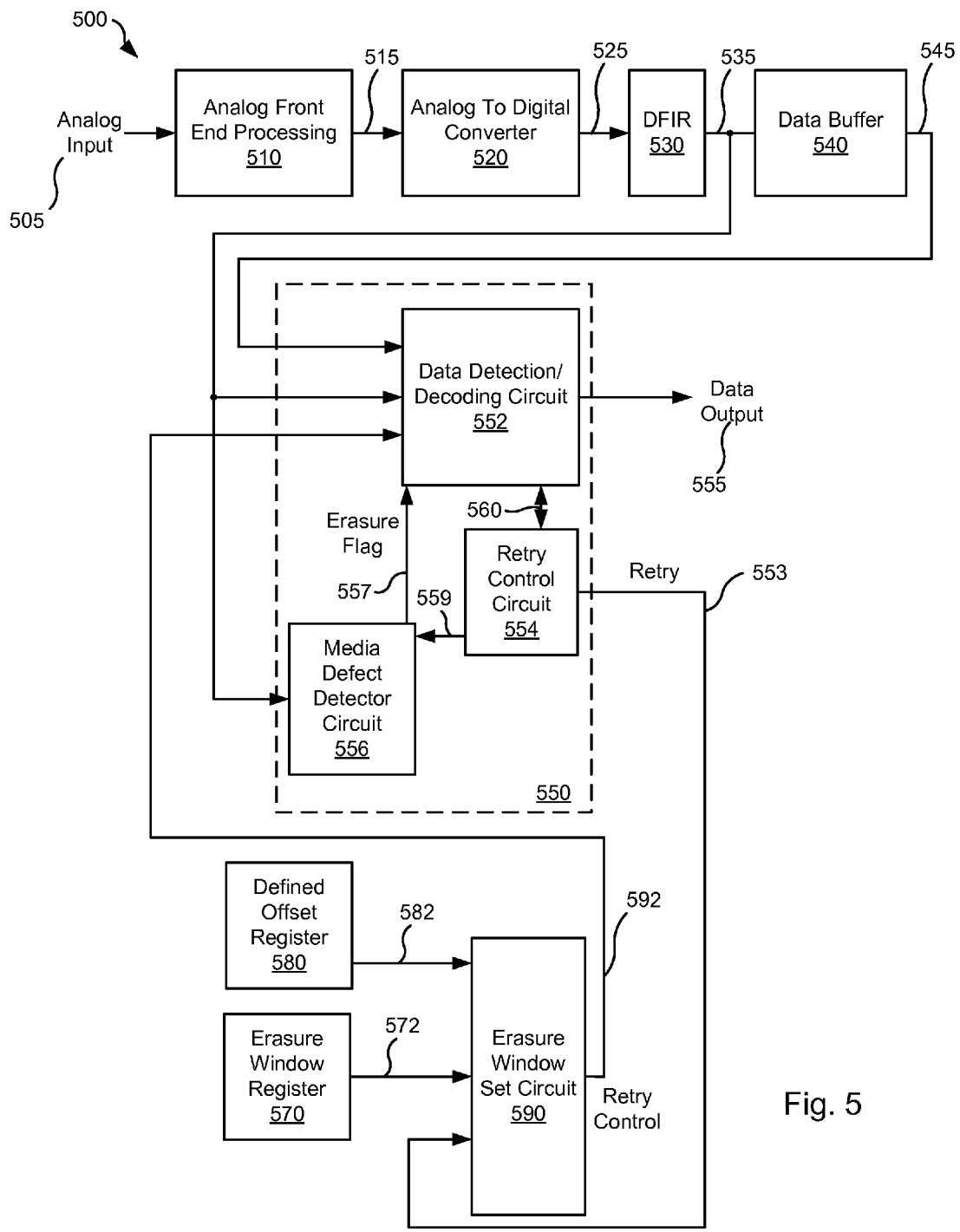
FIG. 5 shows a data processing system including rapid retry sort circuitry in accordance with some embodiments of the present invention.

Turning to FIG. 5, a data processing system 500 including rapid retry sort circuitry is shown in accordance with other embodiments of the present invention. Data processing system 200 includes an analog front end processing circuit 510 that receives an analog input 205. Analog front end processing circuit 510 may include a variety of analog processing circuitry capable of massaging analog input 505 into a useful signal that is provided as an analog processed input 515. In particular, analog front end processing circuit 510 may include, but is not limited to, an equalizer circuit, an amplifier circuit, and/or an analog filter circuit. Based upon the disclosure provided herein, one of ordinary skill in the art will recognize a variety of circuits that may be used in relation to different embodiments of the present invention.

Analog processed input 515 is provided to an analog to digital converter circuit 520 that samples the input at a sampling rate and provides a series of digital samples 525 to a digital finite impulse response filter 530. Analog to digital converter circuit 520 may be any circuit known in the art that is capable of converting an analog input signal into a corresponding series of digital samples. Digital finite impulse response filter 530 may be any digital finite impulse response filter known in the art. Digital finite impulse response filter 530 provides a filtered output 535 to both a data buffer 540 and to a data processing circuit 550. In some embodiments of the present invention, digital finite impulse response filter 530 operates to equalized the received input. In such cases, the filtered output 540 is an equalized output.

Data buffer 540 may be any storage device capable of buffering one or more sets of data. In some embodiments, a set of data is a full sector of data derived from a magnetic storage medium, and data buffer 540 is a non-volatile random access memory. In other cases, data buffer 540 is a dynamic random access memory. Based upon the disclosure provided herein, one of ordinary skill in the art will recognize a variety of storage devices that may be used in relation to different embodiments of the present invention. As more fully described below, the information stored in data buffer 540 may be used for one or more data retry processes attempting to correct errors in digital samples 535 that were not correctable during initial data processing attempts. For the purposes of this document, the phrase "data retry" refers to a data processing using buffered data.

Data processing circuit 550 includes a media defect detector circuit 556 as is known in the art. Media defect detector circuit 256 may be any circuit known in the art that is capable of performing a media defect detection on a data input. U.S. patent application Ser. No. 12/114,462 entitled "Systems and Methods for Media Defect Detection", and filed Apr. 29, 2008 by Tan et al.; and U.S. patent application Ser. No. 12/425,626 entitled "Systems and Methods for Multilevel Media Defect Detection", and filed Apr. 17, 2009 by Yang et al. each disclose some examples of data detection/decoding circuits that may be used in relation to different embodiments of the present invention. The entirety of the aforementioned patent applications is incorporated herein by reference for all purposes. Based upon the disclosure provided herein, one of ordinary skill in the art will recognize a variety of media defect detection circuits that may be used in relation to different embodiments of the present invention. Media defect detector circuit 556 receives filtered output 535 and performs a media defect detection on filtered output 535. The media defect detection process generates an erasure flag 557 that corresponds to the region of the detected media defect. Erasure flag 557 is also provided to a data detection/decoding circuit 552. In addition, media defect detector circuit 556 receives a parameter input 559 from a retry control circuit 554 that allows for changing the operational parameters (e.g., the media defect threshold and/or defect window) of media defect detector circuit 556.

Data processing circuit 550 further includes a data detection/decoding circuit 552 as is known in the art. Data detection/decoding circuit 552 includes one or more data detection circuits that apply a data detection algorithm to the received data, and one or more data decoding circuits that apply a data decoding algorithm to the received data. U.S. patent application Ser. No. 12/114,462 entitled "Systems and Methods for Queue Based Data Detection and Decoding", and filed May 2, 2008 by Yang et al. discloses some examples of data detection/decoding circuits that may be used in relation to different embodiments of the present invention. The entirety of the aforementioned patent application is incorporated herein by reference for all purposes. Based upon the disclosure provided herein, one of ordinary skill in the art will recognize a variety of data detection and/or data decoding circuits that may be used in relation to different embodiments of the present invention. Data detection/decoding circuit 552 provides a data output 555.

Convergence or non-convergence of data output 555 is reported as a control signal 560 to retry control circuit 554. Where data output 555 converges (i.e., data errors are corrected), it is provided as an output and retry control circuit 554 de-asserts a retry output signal 553 indicating that no retry is desired. In addition, retry control circuit 554 resets the value of parameter input 559 that is provided to media defect detector circuit 556.

Otherwise, where data output 555 fails to converge (i.e., fails to correct all errors), one or more different retry processes may be triggered. For example, in one embodiment of the present invention, another normal data processing attempt is made using different media defect parameters. In such a case, updated parameters are provided to media defect detector circuit 556 via parameter input 559. The updated parameters may be selected to detect additional media defects that were not previously detected. As an example, the threshold for identifying a media defect may be lowered. This provides a greater opportunity to detect a media defect, but at the cost of an increased potential of misidentifying media defects. Using the new media defect parameters, a second data processing is started where data is re-introduced via analog input 505 and re-processed. Where the second re-processing fails to converge, a data retry is triggered by asserting retry output signal 553. Alternatively, in another embodiment of the present invention, a data retry is triggered whenever data output 555 fails to converge. In such a case, retry control circuit 554 asserts retry output signal 553 and resets the value of parameter input 559 that is provided to media defect detector circuit 556 whenever a failure to converge is indicated by data detection/decoding circuit 552.

When retry processing is selected as indicated by assertion of retry output signal 553 by retry control circuit 554, an erasure window set circuit 590 provides an erasure control signal 592 indicating a window size and window location over which erasure should be applied by data detection/decoding circuit 552. The window size is programmable via an erasure window register 570 that provides a window size 572 that may be programmed with a number of bit positions over which an erasure is to be applied. Window size 572 is provided to erasure window set circuit 290. An initial offset used for each pass through buffered data 545 is programmed to a defined offset register 580 that in turn provides a defined offset 582 to erasure window set circuit 590.

In some embodiments of the present invention, erasure control signal 592 defines a window of window size 572 that starts at an initial location of zero for the first pass through buffered data 545. Soft data corresponding to the defined window of buffered data 545 is modified. In some cases, the modification includes erasing the soft data so that the reliability of buffered data 545 corresponding to the defined window is indicated as low. In other cases, the soft data is not erased, but rather just reduced. Either way, modifying the soft data in this way allows the data detection algorithm and data decode algorithm applied by data detection/decoding circuit 552 to more readily modify the corresponding elements of buffered data 545.

Where the data processing applied by data detection/decoding circuit 552 converges, data output 555 is provided and the retry processing completes. Otherwise, where the data processing applied by data detection/decoding circuit 552 fails to converge, erasure window set circuit 590 provides an updated erasure control signal 592 and the processing of data detection/decoding circuit 552 is done again. In some embodiments of the present invention, the erasure control signal 592 defines a window of window size 572 that starts at the end point of the previous window and extends over the window size 572 relative to buffered data 545. Thus, for the second retry data processing period, the defined window starts at a location offset from zero by window size 572 and extends over window size 572. This process of data retry continues until either the data processing applied by data detection/decoding circuit 552 converges or until the end of buffered data 545 is reached. The start location of the defined window for each application of the data processing by data detection/decoding circuit 552 may be calculated in accordance with the following equation:

$$\text{Start } Location_i = i^*(\text{Window Size 572}),$$
$$\text{for } i = 0, 1, 2 \ldots \frac{\text{Size(Buffered Data 545)}}{\text{Window Size 572}}.$$

Turning to FIG. 4a, timing diagram 400 graphically depicts a rapid retry during an initial pass (e.g., n=0) after data processing failure in accordance with various embodiments of the present invention; Following timing diagram 400, series of digital samples 411 have erasure pointer 406 generated by erasure flag circuit 590. Erasure pointer 406 begins at a start location (i.e., Window Start $1_N$ 414) that corresponds to a point within digital samples 411 (i.e., at the start of buffered data 545) and extends a window size 404 from the start location. Window size 404 is the same as window size 572. Where the data processing through data detection/decoding circuit 552 fails to converge using the aforementioned location of erasure pointer 406, the location of erasure pointer 406 is updated by applying a step size 412 equal to window size 404 to yield a new start location (i.e., Window Start $1_{N+1}$ 417) and the data processing is retried using erasure corresponding to the new window location. This process continues by stepping the erasure window along digital samples 411 until either the data processing converges or until the end of digital samples is reached.

Referring again to FIG. 5, where application of the data processing by data detection/decoding circuit 552 fails to converge over the length of buffered data 545 (i.e., during a first pass through buffered data 545), an offset is calculated based upon defined offset 582 provided to erasure window set circuit 590. In contrast to the system described above in relation to FIG. 2, the calculated offset is not a function of window size 572, but rather from an independently programmable defined offset 582. In some embodiments of the present invention, the calculated offset may be calculated in accordance with the following equation:

$$Offset_n = \frac{\text{Defined Offset 582}}{2^{n-1}},$$
$$\text{for } n = 1, 2, 3 \ldots \text{maximum passes}.$$

A value of one for n indicates the first pass through buffered data 545, and larger values of n indicate subsequent passes through buffered data 545.

In one particular embodiment of the present invention, the offset used for the second pass through buffered data 545 is window size 572 divided by two. To achieve this, defined offset 582 is programmed to be the same as window size 572. For the initial processing of the second pass through buffered data 545, erasure window set circuit 590 provides an updated erasure control signal 592 and the processing of data detection/decoding circuit 552 is done again. The updated erasure control signal 592 defines a window of window size 572 that starts at the calculated offset and extends over window size 572 relative to buffered data 545. Where the data processing applied by data detection/decoding circuit 552 converges, data output 555 is provided and the retry processing completes. Otherwise, where the data processing applied by data detection/decoding circuit 552 fails to converge, erasure window set circuit 590 provides an updated erasure control signal 592 and the processing of data detection/decoding circuit 552 is done again. In some embodiments of the present invention, the erasure control signal 592 defines a window of window size 572 that starts at the previous window end point and extends over the window size 272 relative to buffered data 545. Thus, for the second retry data processing period, the defined window starts at a location offset from zero by window size 572 and extending over window size 572. This process of data retry continues until either the data processing applied by data detection/decoding circuit 552 converges or until the end of buffered data 545 is reached. The start location of the defined window for each application of the data processing by data detection/decoding circuit 552 may be calculated in accordance with the following equation:

$$\text{Start } Location_i = \text{Calculated } Offset_n + i^*(\text{Window Size 272}),$$
$$\text{for } i = 0, 1, 2 \ldots \frac{\text{Size(Buffered Data 245)}}{\text{Window Size 272}}.$$

A value of zero for i indicates the initial application of the data processing by data detection/decoding circuit 552, and larger values of i indicate subsequent application of the data processing.

Turning to FIG. 4b, timing diagram 401 graphically depicts a rapid retry during second pass (e.g., n=1) after data processing failure in accordance with various embodiments of the present invention. Following timing diagram 401, digital samples 411 have erasure pointer 406 generated by erasure flag circuit 590. Erasure pointer 406 begins at a start location (i.e., Window Start $2_N$ 426) that corresponds to a point within digital samples 411 (i.e., at the start of buffered data 545 plus the calculated offset and referred to as a second pass offset 425) and extends a window size 404 from the start location. Second pass offset 425 may be some dimension smaller than window size 572 for the second pass. In some cases, second pass offset 425 is one half of window size 572. Where the data processing through data detection/decoding circuit 552 fails to converge using the aforementioned location of erasure pointer 406, the location of erasure pointer 406 is updated by applying a step size 412 equal to window size 404 plus pass offset 425 to yield a new start location (i.e., Window Start $2_{N+1}$ 427) and the data processing is retried using erasure corresponding to the new window location. This process continues by stepping the erasure window along digital samples 411 by window size 272 until either the data processing converges or until the end of digital samples is reached.

Referring again to FIG. 2, This process may continue for three or more passes through buffered data 545 until a maximum number of passes (i.e., maximum passes) through buffered data 545 have been completed. Turning to FIG. 4c, timing diagram 402 graphically depicts a rapid retry during second pass (e.g., n=1) after data processing failure in accordance with various embodiments of the present invention. Following timing diagram 402, digital samples 411 have erasure pointer 406 generated by erasure flag circuit 590. Erasure pointer 406 begins at a start location (i.e., Window Start $3_N$ 436) that corresponds to a point within digital samples 411 (i.e., at the start of buffered data 545 plus the calculated offset and referred to as third pass offset 435) and extends a window size 404 from the start location. Third pass offset 435 is one quarter of window size 572 for the third pass. Where the data processing through data detection/decoding circuit 552 fails to converge using the aforementioned location of erasure pointer 406, the location of erasure pointer 406 is updated by applying step size 412 equal to window size 404 plus pass offset 435 to yield a new start location (i.e., Window Start $3_{N+1}$ 437) and the data processing is retried using erasure corresponding to the new window location. This process continues by stepping the erasure window along digital samples 411 by window size 572 until either the data processing converges or until the end of digital samples is reached. This process may be repeated for fourth and later passes with the pass offset being divided by two for each successive pass.

The following pseudocode describes the operation of data processing system 500 in accordance with some embodiments of the present invention.

```
If (Retry Output Signal 553 is De-Asserted) {
    Apply Standard Processing by Data Processing Circuit 550;
    If (Data Output 555 Converged){
        Provide Data Output 555
    }
    Else If (Data Output 555 Failed to Converge){
        Assert Retry Output Signal 553;
    }
}
Else If (Retry Output Signal 553 is Asserted){
    Set Process Counter i = 0;
    Set Pass Counter n = 0;
    Set the Calculated Offset = 0;
    If (n<Maximum Passes){
        Set the Start of the Modification Window = Calculated Offset +
        (Window Size 572) *i;
        Apply Standard Processing by Data Processing Circuit 550;
        If (Data Output 555 Converged){
            Provide Data Output 555;
            Set n =Maximum Passes;
            Set i = Size(Buffer Data 545) / Window Size 572;
        }
        Else If (Data Output 555 Failed to Converge){
            Set i = i +1;
            If (i > Size(Buffer Data 545) divided by Window Size 572){
                Set n = n +1;
                Set Calculated Offset = Defined Offset 282 / 2^n;
            }
        }
    }
    Else If (n = Maximum Passes){
        De-assert Retry Output Signal 253;
    }
}
```

Of note, the aforementioned approach searches only 0, (Defined Offset 272)/2, (Defined Offset 272)/4, (Defined Offset 272)/8, and on. Other embodiments of the present invention are modified to make a more extensive search to include additional possibilities including: 0, (Defined Offset 272)/2, (Defined Offset 272)/4, 3*(Defined Offset 272)/4, (Defined Offset 272)/8, 3*(Defined Offset 272)/8, 5*(Defined Offset 272)/8, 7*(Defined Offset 272)/8, and on. Additionally, data processing system 200 may have enough bandwidth to operate on more than one sector at a time. In such a case, this bandwidth capability may be applied to processing two or more different scenarios at the same time, that is, have the detector/decoder working on multiple instances of the same data with the erasure window at a different position each time. Such an approach could be used reduce the overall recovery time by a factor of however many simultaneous scenarios can be simultaneously run.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for isolating and/or correcting data errors associated with storage media. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system, comprising:
    a buffer circuit operable to stored the data set as a buffered data set;
    a data processing circuit operable to repeatedly apply a data processing algorithm to the buffered data set, wherein applying the data processing algorithm includes reducing a likelihood that a plurality of elements of the buffered data set within an erasure window were properly set during a preceding application of the data processing algorithm to yield a processed output;
    an erasure window set circuit operable to define a location of the erasure window of a window size in relation to the buffered data set, wherein the erasure window set circuit is operable to:
        offset the erasure window from the beginning of the buffered data set by a first offset for a first pass through the buffered data set,
        offset the erasure window from the beginning of the buffered data set by a second offset for a second pass through the buffered data set, and
        offset the erasure window from the beginning of the buffered data set by a third offset for a third pass through the buffered data set, wherein the third pass through the buffered data set occurs subsequent to the second pass through the buffered data set, and wherein the third offset is less than the second offset.

2. The data processing system of claim 1, wherein the window size is programmable.

3. The data processing system of claim 1, wherein the second offset and the third offset are each a function of the window size.

4. The data processing system of claim 3, wherein the second offset is one half the window size and the third offset is one quarter the window size.

5. The data processing system of claim 1, wherein the second offset and the third offset are each a function of a defined offset size.

6. The data processing system of claim 5, wherein the defined offset size is programmable.

7. The data processing system of claim 1, wherein the erasure window set circuit is further operable to:
indicate a first start location of the erasure window as the first offset, and calculate a second start location of the erasure window as the first offset plus a step size;
indicate a third start location of the erasure window as the second offset, and calculate a fourth start location of the erasure window as the second offset plus the step size; and
indicate a fifth start location of the erasure window as the third offset, and calculate a sixth start location of the erasure window as the third offset plus the step size.

8. The data processing system of claim 7, wherein the step size is the window size.

9. The data processing system of claim 1, wherein the data processing system is implemented as part of an integrated circuit.

10. The data processing system of claim 1, wherein the data processing system is implemented as part of a storage device.

11. The data processing system of claim 1, wherein the data processing circuit includes a data detector circuit operable to apply a data detection algorithm to the buffered data set to yield a detected output, and a data decoding circuit operable to apply a data decode algorithm to the detected output to yield the processed output.

12. The data processing system of claim 11, wherein the data processing algorithm includes the data detection algorithm and the data decode algorithm.

13. The data processing system of claim 11, wherein the data detector circuit is a maximum a posteriori data detector circuit, and the data decoding circuit is a low density parity check decoding circuit.

14. A method for retry processing, the method comprising:
buffering a series of data samples to yield a series of buffered data samples;
determining a first offset of an erasure window from the beginning of the a series of buffered data samples;
applying a data processing algorithm to the series of buffered data samples, wherein applying the data processing algorithm includes reducing a likelihood that a plurality of elements of the series of buffered data samples within the erasure window having the first offset were properly set during a preceding application of the data processing algorithm to yield a first processed output;
determining a second offset of the erasure window from the beginning of the series of buffered data samples;
re-applying the data processing algorithm to the series of buffered data samples, wherein re-applying the data processing algorithm includes reducing a likelihood that a plurality of elements of the series of buffered data samples within the erasure window having the second offset were properly set during a preceding application of the data processing algorithm to yield a second processed output;
determining a third offset of the erasure window from the beginning of the series of buffered data samples;
re-applying the data processing algorithm to the series of buffered data samples, wherein re-applying the data processing algorithm includes reducing a likelihood that a plurality of elements of the series of buffered data samples within the erasure window having the third offset were properly set during a preceding application of the data processing algorithm to yield a second processed output; and
wherein the third offset is less than the second offset.

15. The method of claim 14, wherein the second offset is one half the window size and the third offset is one quarter the window size.

16. The method of claim 14, wherein the method further comprises:
indicating a first start location of the erasure window as the first offset, and calculating a second start location of the erasure window as the first offset plus a step size;
indicating a third start location of the erasure window as the second offset, and calculating a fourth start location of the erasure window as the second offset plus the step size; and
indicating a fifth start location of the erasure window as the third offset, and calculating a sixth start location of the erasure window as the third offset plus the step size.

17. A data processing system, the system comprising:
a data access circuit configured to receive an analog input, wherein the data access circuit includes:
a buffer circuit operable to store a data set derived from the analog input as a buffered data set;
a data processing circuit operable to repeatedly apply a data processing algorithm to the buffered data set, wherein applying the data processing algorithm includes reducing a likelihood that a plurality of elements of the buffered data set within an erasure window were properly set during a preceding application of the data processing algorithm to yield a processed output; and
an erasure window set circuit operable to dynamically define a location of the erasure window of a window size in relation to the buffered data set;
wherein defining the location of the erasure window of in relation to the buffered data set includes:
offsetting the erasure window from the beginning of the buffered data set by a first offset for a first pass through the buffered data set;
offsetting the erasure window from the beginning of the buffered data set by a second offset for a second pass through the buffered data set; and
offsetting the erasure window from the beginning of the buffered data set by a third offset for a third pass through the buffered data set, wherein the third pass through the buffered data set occurs subsequent to the second pass through the buffered data set, and wherein the third offset is less than the second offset.

18. The data processing system of claim 17, wherein the second offset is one half the window size and the third offset is one quarter the window size.

19. The data processing system of claim 17, wherein the erasure window set circuit is further operable to:
indicate a first start location of the erasure window as the first offset, and calculate a second start location of the erasure window as the first offset plus a step size;
indicate a third start location of the erasure window as the second offset, and calculate a fourth start location of the erasure window as the second offset plus the step size; and indicate a fifth start location of the erasure window as the third offset, and calculate a sixth start location of the erasure window as the third offset plus the step size.

20. The data processing system of claim 19, wherein the step size is the window size.

21. The data processing system of claim 17, wherein data processing system is implemented as part of a data storage device, and wherein the data storage device further comprises:
   a storage medium, wherein the analog input represents data derived from the storage medium;
   a read/write head assembly disposed in relation to the storage medium, wherein the data access circuit is operable to receive the analog input from the read/write head assembly; and
   wherein the data access circuit further includes an analog to digital converter circuit operable to convert a signal derived from the analog input to a series of digital samples.

22. The data processing system of claim 17, wherein the second offset and the third offset are each a function of the window size.

23. The data processing system of claim 22, wherein the second offset is one half the window size and the third offset is one quarter the window size.

* * * * *